United States Patent [19]
Yamaguchi et al.

[11] Patent Number: 5,789,274
[45] Date of Patent: Aug. 4, 1998

[54] WAVELENGTH-TUNABLE SEMICONDUCTOR LASER AND FABRICATION PROCESS THEREOF

[75] Inventors: Masayuki Yamaguchi; Mitsuhiro Kitamura, both of Tokyo, Japan

[73] Assignee: NEC Corporation, Tokyo, Japan

[21] Appl. No.: 630,625

[22] Filed: Apr. 10, 1996

Related U.S. Application Data

[62] Division of Ser. No. 503,089, Jul. 17, 1995, Pat. No. 5,541,945.

[30] Foreign Application Priority Data

Jul. 17, 1994 [JP] Japan .................. 6-163515
Aug. 29, 1994 [JP] Japan .................. 6-203372

[51] Int. Cl.$^6$ .................................. H01L 21/00
[52] U.S. Cl. .................... 438/32; 438/35; 438/39
[58] Field of Search .................... 437/129; 372/20, 372/50, 45, 46, 96; 438/32, 35, 39; 385/10

[56] References Cited

U.S. PATENT DOCUMENTS

| | | |
|---|---|---|
| 4,719,636 | 1/1988 | Yamaguchi . |
| 4,755,015 | 7/1988 | Uno et al. ................. 372/50 |
| 4,920,542 | 4/1990 | Brosson et al. ............. 372/20 |
| 5,325,382 | 6/1994 | Emura et al. . |
| 5,349,598 | 9/1994 | Ouchi et al. . |
| 5,450,428 | 9/1995 | Maeda . |
| 5,459,747 | 10/1995 | Takiguchi et al. ........... 372/50 |
| 5,557,700 | 9/1996 | Nakamura et al. ........... 372/45 |

FOREIGN PATENT DOCUMENTS

| | | |
|---|---|---|
| 0173269A3 | 3/1986 | European Pat. Off. . |
| 0370443A1 | 5/1990 | European Pat. Off. . |
| 0606093A3 | 7/1994 | European Pat. Off. . |
| 61-54690 | 3/1986 | Japan . |
| 61-95592 | 5/1986 | Japan . |
| 4148579 | 5/1992 | Japan . |
| 715084 | 1/1995 | Japan . |

OTHER PUBLICATIONS

S. Murata et al.; "Electronics Letters"; vol. 23, No. 8, pp. 403–405 Apr. 1997.

O. Ishida et al.; "Tuning–current splitting network for three–section DBR lasers"; Electronics Letters, vol. 30, No. 3, pp. 241–242.

Y. Kotaki et al.; "Wavelength Tunable Semiconductor Lasers"; Electronics and Communications in Japan, Part 2, Feb. 1991; pp. 29–38.

T. Sasaki et al.; "10 Wavelength MQW–DBR Lasers Fabricated by Selective MOVPE Growth"; Electronics Letters, vol. 30, No. 10, 12th May 1994, pp. 785–786.

*Primary Examiner*—Brian Dutton
*Attorney, Agent, or Firm*—Whitham, Curtis & Whitham

[57] ABSTRACT

A wavelength tunable semiconductor laser includes an active region including an active layer generating an optical gain by injection of a current, a phase control region including a tuning layer generating variation of a refraction index by injection of the current, and a distributed Bragg reflector region including a tuning layer generating variation of a refraction index by injection of the current. The active region, the phase control region and the distributed Bragg reflector region are arranged in alignment in a resonance direction. A diffraction grating is provided in the vicinity of the tuning layer of the distributed Bragg reflector region. The wavelength tunable semiconductor laser includes a device for uniformly injecting a current to the phase control region and the distributed Bragg reflector region. The optical confinement factor to the tuning layer of the phase control region is greater than an optical confinement factor to the tuning layer of the distributed Bragg reflector type.

1 Claim, 10 Drawing Sheets

ENERGY BAND OF PHASE
CONTROL LAYER

ENERGY BAND OF DBR
WAVEGUIDE LAYER

WAVELENGTH-TUNABLE SEMICONDUCTOR LASER AND FABRICATION PROCESS THEREOF

This is a divisional Application of application Ser. No. 08/503,089 filed Jul. 17, 1995, now U.S. Pat. No. 5,541,945.

BACKGROUND OF THE INVENTION

1. Field of the Invention

The present invention relates to a wavelength tunable semiconductor laser and fabrication process thereof. More specifically, the invention relates to a wavelength tunable semiconductor laser which is important for application to optical communication, optical measurement.

2. Description of Related Art

Importance for the wavelength tunable semiconductor laser has been growing in application to wavelength division multiplexing transmission system, wavelength division switching system, wavelength cross-connection system and so forth of trunk system of an optical communication, as well as in the field of optical measurement.

Bitrate of optical fiber communication has been increased significantly, in the recent years. Currently, the transmission bitrate has reached to be restricted by the bandwidth of electric circuit at transmitter and receiver portions. Therefore, as means for easily increasing transmission capacity without being electrically restricted with respect to the transmission speed, wavelength division multiplexing (WDM) transmission system has been attracting attentions. Also, wavelength division optical switching system, wavelength cross connection system and so forth have currently been attracting attentions. In these system, a wavelength tunable semiconductor laser plays an important role. It is desirable that the wavelength tunable laser has a function to permit continuous wavelength control by a single control current or control voltage. If two or more control currents are present, complicate control becomes necessary for obtaining the desired wavelength.

One of such wavelength tunable laser is a distributed Bragg reflector (DBR) semiconductor laser. The prior art DBR semiconductor laser will be briefly discussed with reference to FIG. 1. It should be noted that the prior art similar to that illustrated in FIG. 1 have been disclosed in Japanese Unexamined Patent Publication (Kokai) No. Showa 61-54690 or S. Murata et al. "Electronics Letters", Vol. 23, No. 8, pp 403 to 405, published on Apr. 9, 1987, for example. As seen from FIG. 1, 3 regions, i.e. an active region, a phase control region and DBR region are divided in a direction of resonator. In the active region, an active layer 10 is provided. On the other hand, in the phase control region and the DBR region, a tuning layer 104 is provided. Also, in the DBR region, a deflection grading 110 is provided in the vicinity of the tuning layer 104. On respective region, electrodes 111, 112 and 113 are formed for permitting independent injection of current to respective regions. In FIG. 1, $I_a$ denotes a laser current, and $I_t$ denotes a tuning current. In case of such 3 section DBR laser, the wavelength is shifted toward short wavelength with accompanied lasing mode jumps by increasing current applied to the DBR region, as shown by the wavelength tuning characteristics of FIG. 2. During jumping of the mode, the wavelength range can be covered by adjusting the current applied to the phase control region.

However, in view point of application of the wavelength tunable semiconductor laser to the actual system, controlling of two currents (phase control current and DBR current) in order to obtain laser oscillation at desired wavelength is required a complicated operation. Therefore, it is desirable to make it possible to set the desired wavelength by a single control current. Continuous wavelength control in the DBR laser, as disclosed in Japanese Unexamined Patent Publication No. Showa 61-54690 as set forth above, can be obtained by satisfying the following relationship.

$$\Delta n_d/\Delta n_p = L_p/(L_p + L_a) \qquad (1)$$

wherein $\Delta n_d$ and $\Delta n_p$ are variation amounts of equivalent refraction indexes due to constant injection at the DBR region and the phase control region, Lp and La are lengths of the phase control region and the active region. By optimizing the ratio of the injection currents to the phase control region and the DBR region by a resistance division for satisfying the foregoing equation (1), continuous wavelength tuning operation becomes possible. By this method, maximum 3.8 nm of continuous wavelength control operation has been reported in O. Ishida et al. "Electronics Letters" Vol. 30, No. 3, pp 241 to 242, published on Feb. 3, 1994.

However, in such current division method, it is difficult to maintain the ratio between the phase control current and the DBR current, constant. Therefore, it is possible to cause jump of the mode at the midway of wavelength tuning operation as shown in FIG. 3, which show wavelength variation versus tuning current for current divion method. In order to avoid this, it is effective to set the resistance value for current division sufficiently greater than the series resistance of the phase control and the DBR region. However, there is such case, another problems, such as difficulty in establishing impedance matching required for high speed switching of the lasing wavelength.

SUMMARY OF THE INVENTION

Therefore, it is an object of the present invention to provide a wavelength tunable DBR laser which permits continuous wavelength control with a single control current without employing a current dividing method.

According to one aspect of the invention, there is provided a wavelength tunable semiconductor laser, comprising: an active region including an active layer generating an optical gain by injection of a current; a phase control region including a tuning layer generating variation of a refraction index by injection of the current; a distributed Bragg reflector region including a tuning layer generating variation of a refraction index by injection of the current, said active region, said phase control region and said distributed Bragg reflector region being arranged in alignment in a resonance direction; and a diffraction grating provided in the vicinity of said tuning layer of said distributed Bragg reflector region. The wavelength tunable semiconductor comprises means for uniformly injecting a current to said phase control region and said distributed Bragg reflector region. An optical confinement factor to said tuning layer of said phase control region is greater than an optical confinement factor to said tuning layer of said distributed Bragg reflector region.

Preferably, the thickness of the tuning layer of the phase control region is thicker than the thickness of the tuning layer of the distributed Bragg reflector region.

According to another aspect of the invention, a wavelength tunable semiconductor laser comprises means for uniformly injecting a current to the phase control region and the distributed Bragg reflector region. Compositions of tuning layers of the phase control region and the distributed Bragg reflector region is set so that a variation of refraction index within the tuning layer in the phase control region as applied the current is greater than a variation of refraction index within the tuning layer in the distributed Bragg reflector region as applied the current.

Preferably, the wavelength composition of the tuning ayer of the phase control region may be longer than the avelength composition of the tuning layer of the distributed Bragg reflector region.

Also, in the preferred construction, the tuning layers of the phase control region and the distributed Bragg reflector region are set to satisfy:

$$\Gamma_{dbr}\Delta n_{dbrd}/\Delta_{pc}\Delta n_{pc}=L_{pc}/(L_a+L_{pc}) \quad (2)$$

wherein $\Gamma_{dhr}$ is the optical confinement factor of the distributed Bragg reflector region;

$\Gamma_{pc}$ is the optical confinement factor of the phase control region;

$\Gamma n_{dhr}$ is a variation of the refraction index of the distributed Bragg reflector region;

$\Gamma n_{pc}$ is a variation of the refraction index of the phase control region;

$L_a$ is a length of the active region; and $L_{pc}$ is a length of the phase control region.

According to a further aspect of the invention, a fabrication process of a wavelength tunable semiconductor laser comprises the steps of: forming a stripe form tuning layer at a portion of a semiconductor substrate corresponding to a phase control region and a distributed Bragg reflector region, and forming a stripe form active layer at a portion of the semiconductor substrate corresponding to an active region; forming a refraction grating in the vicinity of the tuning layer of the distributed Bragg reflector region; forming a cladding layer for burying the stripe for tuning layer and the active layer; and forming electrodes on upper portion of the active region, the phase control region and the distributed Bragg reflector region and on lower portion of the substrate. The tuning layers is formed by way of a selective MOVPE method so as to satisfy one of the condition that a layer thickness of the tuning layer of the phase control layer is thicker than a layer thickness of the tuning layer of the distributed Bragg reflector region, and that the wavelength composition of the phase control layer is longer than that of the distributed Bragg reflector region.

According to a still further aspect of the invention, a wavelength tunable semiconductor laser comprises: an active region including an active layer for generating an optical gain by injection of a current; a phase control region including a phase control layer generating variation of a refraction index by injection of the current; and a distributed Bragg reflector region including a distributed Bragg reflector waveguide layer generating variation of a refraction index by injection of the current and a diffraction grating, said active region, said phase control region and said distributed Bragg reflector region being arranged in alignment in a resonance direction; and an electrode common to said phase control region and said distributed Bragg reflector region; an energy band structure of the semiconductor layer forming said phase control layer being negative effective mass at a valence band and said energy band structure of the semiconductor layer forming said distributed Bragg reflector region being positive effective mass at a valence band.

According to a yet further aspect of the invention, a wavelength tunable semiconductor laser comprises: an electrode common to said phase control region and said distributed Bragg reflector region; the width of said phase control layer being wider than that of said distributed Bragg reflector waveguide layer.

According to a yet further aspect of the invention, a wavelength tunable semiconductor laser comprises: an electrode common to said phase control region and said distributed Bragg reflector region; and a second phase control region having an independent electrode being provided on the end face of said active region.

According to a still further aspect of the invention, a wavelength tunable semiconductor laser comprises: a phase control region tunable of refraction index by application of an electric control signal; an active region provided at one side of said phase control region and including an active layer generating an optical gain by injection of current; a distributed Bragg reflector region located at the other side of said phase control region; a first tuning layer provided in said distributed Bragg reflector region and causing variation of an optical characteristics by application of an electric tuning control signal; a second tuning layer provided in said phase control region and causing variation of an optical characteristics by application of an electric tuning control signal, said second tuning layer having a response of larger refraction index variation to said electric tuning control signal in comparison with said first tuning layer; and a single tuning control signal source supplying a common tuning control signal to said first and second tuning layers for continuous wavelength control.

In the preferred construction, the first and second tuning layers are common layer having mutually different geometry to have mutually different refraction index change to said electric tuning control signal. The first and second tuning layers may be differentiated in thickness in a cross section along a resonance direction of the light. The second tuning layer may have greater thickness than said first tuning layer to have greater variation of refraction index than that of said first tuning layer. The second tuning layer may have greater optical confinement factor than that of said first tuning layer.

Preferably, the first and second tuning layers are formed simultaneously by a selective metal organic vapor phase epitaxial growth method.

In the alternative, the first and second tuning layers may be common layer having mutually different crystal compositions to have mutually different refraction index change to said electric tuning control signal. In such case, the first and second tuning layers having mutually different crystal composition have mutually different energy band structures. The second tuning layer may have greater variation of a refraction index than that of said first tuning layer, upon application of said electric tuning control signal.

In the foregoing condition of the equation (1) for continuous wavelength control, by expressing the equivalent refraction indices of the phase control region and the DBR region are expressed by employing the material index change of the tuning layer and an optical confinement factor, the equation (1) can be rewritten as follow:

$$\Gamma_{dbr}\Delta n_{dbr}/\Gamma_{pc}\Delta n_{pc}=L_{pc}/(L_a+L_{pc}) \quad (2)$$

wherein $\Gamma_{pc}$ and $\Gamma_{dbr}$ are optical confinement factors for the tuning layer of the phase control region and the DBR region, and $\Delta n_{pc}$ and $\Delta n_{dbr}$ are variation of refraction indices in the tuning layer of the phase control region and the DBR region. For achieving continuous wavelength control with injection of a uniform current to the phase control region and the DBR region without employing the resistance for dividing tuning current, the layer thickness at the tuning layer at the phase control region is made thicker than that of the DBR region to make the optical confinement factor in the tuning layer of the phase control region greater than that of the DBR region, so that $P_{pc}>P_{dbr}$ is established. Another solution for achieving continuous wavelength control is that the wavelength composition of the tuning layer of the phase control region is set to be longer than the wavelength composition of the tuning layer of the DBR region to make the variation of the refraction index of the tuning layer on the phase control region is greater than that on the DBR region, so that $\Delta n_{pc} > \Delta n_{dpr}$ is established.

Conventionally, in the adjacent phase control region and the DBR region, it is very difficult to selectively form layers having different layer thickness or layer composition. Recently developed selective MOVPE technology makes it possible to selectively form layers having different layer thickness or layer composition. The selective MOVPE method employs a principle that the layer thickness of the epitaxial layer and the wavelength composition in the region sandwiches by the $SiO_2$ (insulation) stripes is varied depending upon the width of $SiO_2$ stripe, by forming pairs of $SiO_2$ stripes on a semiconductor substrate and performing MOVPE crystal growth thereon. Wider width of the stripe width of the $SiO_2$ stripe makes the layer thickness of epitaxial semiconductor layer formed therebetween thicker and makes the wavelength composition longer. Identical tendency may be attained when a multiple-quantum well structure is formed as the epitaxial layer. In this case, variation of the effective. wavelength composition can be inclined to be further enhanced.

There are other approaches to satisfy equation (2). In one approach, in consideration of the variation amount of the material refraction index, the wavelength tunable semiconductor laser is constructed to have the band energy structure of the phase control region to have negative effective mass in the valence band. By this, the state density at the band end is swiftly risen. Thus, quite large variation of refraction can be obtained. Obtaining large variation amount of refraction index has been proposed in commonly owned Japanese Patent Application No. Heisei 5-154039. The disclosure of the above-identified commonly owned co-pending Japanese Patent Application is herein incorporated by reference.

In another approach, the optical confinement factor of the phase control layer is made grater than that of the DBR waveguide layer by providing wider width for the phase control layer than that of the DBR waveguide layer. Typically, the width is approximately 2 μm, and variation of the width in the back-and-forth direction may not influence to the optical confinement factor. However, when the width of the DBR waveguide is reduced to be approximately 0.5 μm, relatively large optical confinement factor of the phase control layer relative to the DBR waveguide by setting the width of the phase control layer at approximately 2 μm.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The preferred embodiments of wavelength tunable semiconductor lasers according to the present invention will be discussed in detail with. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

(First Embodiment)

Figure 1:
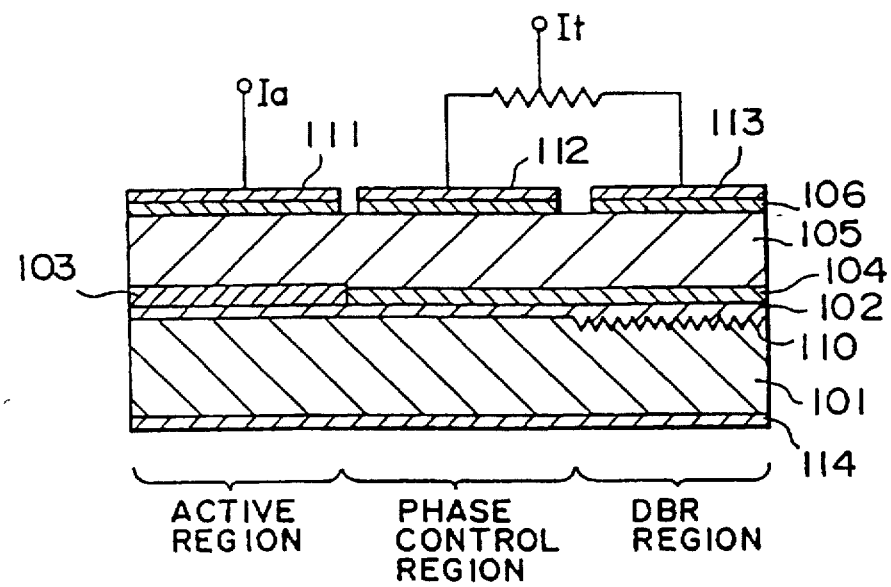
FIG. 1 is a section showing one example of the conventional wavelength tunable semiconductor laser.
Figure 2:
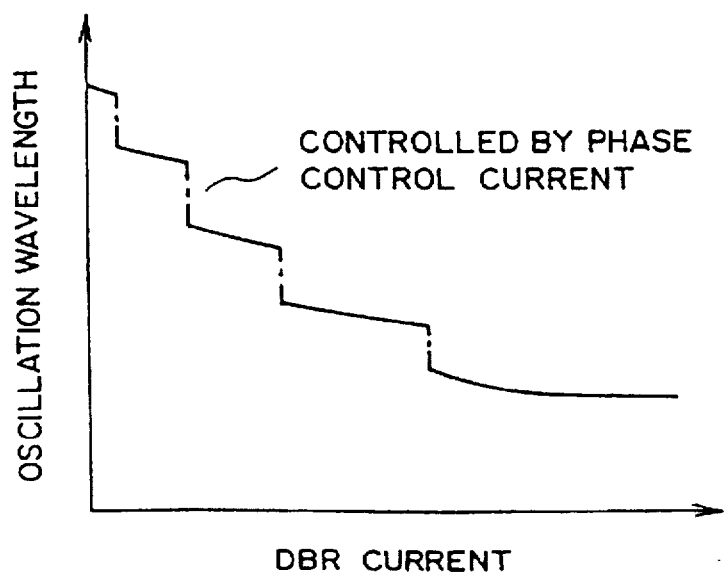
FIG. 2 is a chart showing the characteristics of the conventional wavelength tunable semiconductor laser of FIG. 1.
Figure 3:
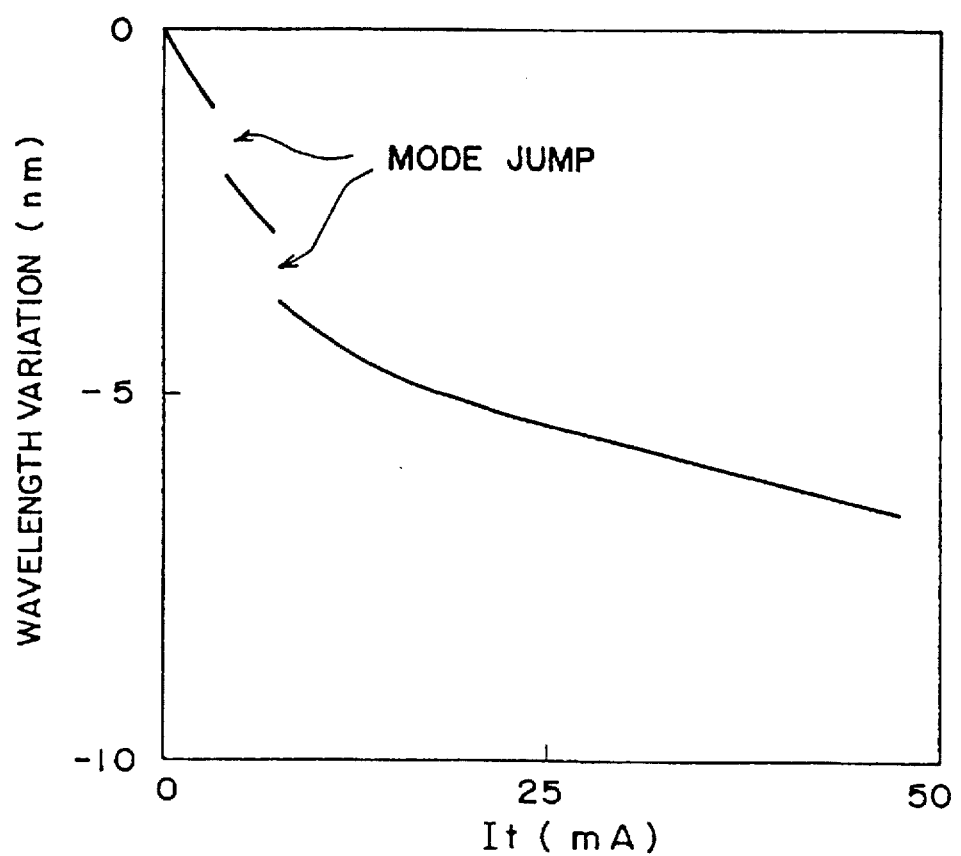
FIG. 3 is a chart showing the characteristics of the conventional wavelength tunable semiconductor laser.
Figure 4:
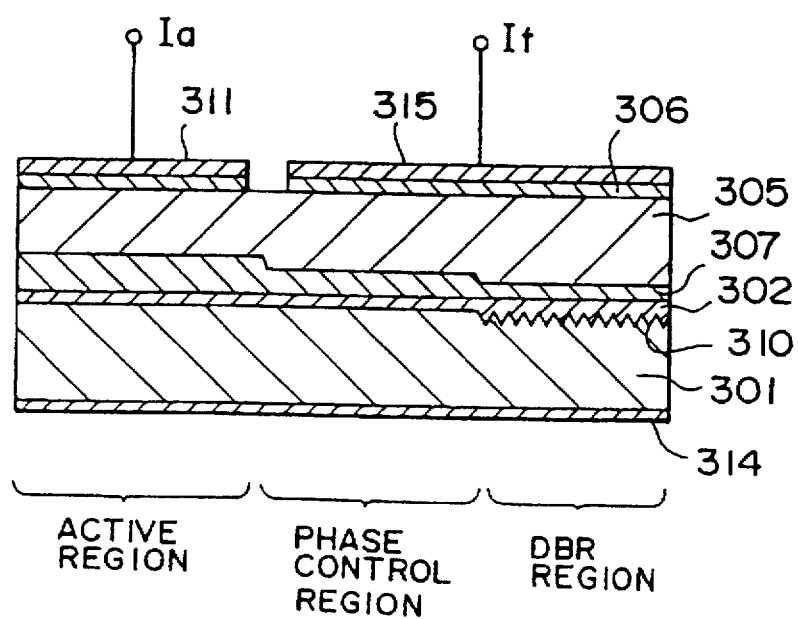
FIG. 4 is a section showing a construction of the first embodiment of a wavelength tunable semiconductor laser according to the invention.

FIG. 4 shows the first embodiment of a construction of a wavelength tunable DBR laser having a wavelength in 1.55 μm range according to the present invention. On a portion corresponding to a DBR region on a n- type InP substrate, a diffraction grating 310 (having 240 nm period) is formed. On the entire surface of the diffraction grating 310, n-type InGaAs guide layer 302 (having 0.1 μm thickness) having wavelength composition of 1.3 μm, a tuning and active layer 307 consisted of InGaAs/InGaAsP multiple-quantum well layer (MQW) which has ten well layers, and p-type InP cladding layer 305 (in a thickness of approximately 2 μm) are formed. A p+-type InGaAs cap layer 306 formed over the p-type InP cladding layer 305 is removed for electrical isolation at the position between a phase control region and an active region. On the active region, an electrode 311 is formed. Similarly, on the phase control region and the DBR region, an electrode 315 is formed. Beneath the n- type InP substrate (semiconductor substrate) 301, a grounding electrode 314 is formed. The lengths of the active region, the phase control region and the DBR region are respectively $L_a$=300 µm, $L_{pc}$=300 µm and $L_{dbr}$=200 µm. Also, $I_a$ denotes a laser current and $I_t$ denotes a tuning current.

The tuning and active layer 307 is grown by selective MOVPE method. The wavelength compositions (effective band gap wavelength) is 1.55 µm at the active region, 1.47 µm at the phase control region and 1.40 µm at the DBR region. The layer thicknesses of the active region, the phase control region and the DBR region are respectively 0.3 µm, 0.23 µm and 0.15 µm. Since the lasing wavelength determined by the period of the diffraction grating is 1.55 µm, the tuning and active layer 307 operates as active layer for generating an optical gain by injection of current in the active region and also acts as a passive tuning layer at the phase control region and the DBR region. In the construction set forth above, an optical confinement factor $\Gamma_{pc}$ of the phase control region is greater than an optical confinement factor $\Gamma_{dbr}$ of the DBR region ($\Gamma_{pc}$>$\Gamma_{dbr}$). Also, variation of refraction index $\Delta n_{pc}$ in the tuning layer in the phase control region upon injection of the current is greater than variation of refraction index $\Delta n_{dbr}$ in the DBR region ($\Delta n_{pc}$>$\Delta n_{dbr}$). As a result, the term of the foregoing equation (2) can be satisfied.

Figure 5A:
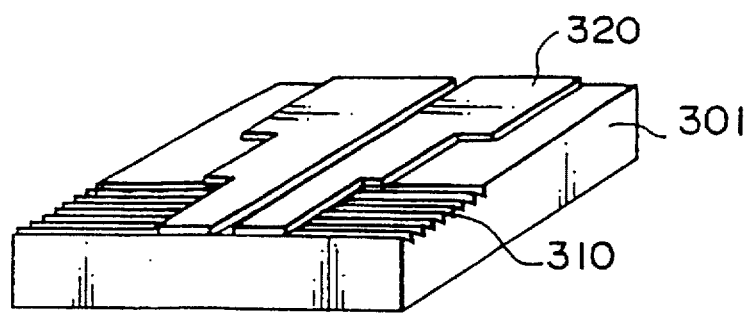
FIGS. 5A to 5C are perspective views showing a fabrication process of the first embodiment of a wavelength tunable semiconductor laser according to the invention.
Figure 5B:
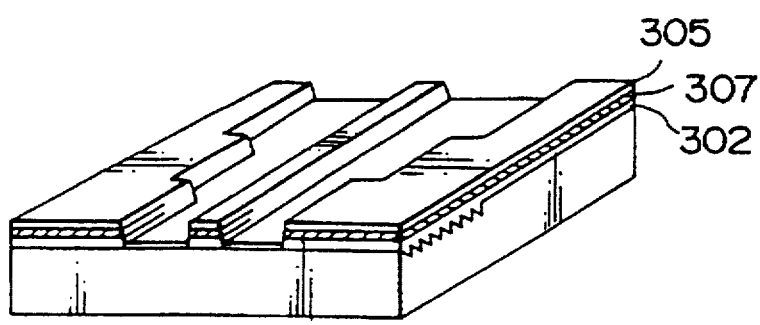
Figure 5C:
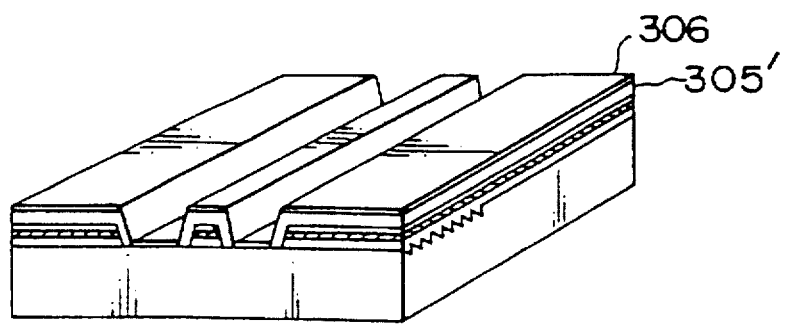

FIGS. 5A to 5C respectively show process steps in fabrication of the first embodiment of the wavelength tunable DBR laser according to the invention. At a step illustrated in FIG. 5A, the diffraction grating 310 is partially formed on the n-type InP substrate 301. On the substrate 301 with the diffraction grating 310, $SiO_2$ stripes 320 extending in parallel relationship to each other with defining a stripe region of 1.5 µm width, is patterned. The stripe region forms an optical waveguide. The width of each of the $SiO_2$ stripe 320 is the narrowest in the DBR region. The width of the $SiO_2$ stripe 320 is increased in stepwise fashion to have greater width in the phase control region and to have the greatest width in the active region. In concrete, the widths of the $SiO_2$ stripes 320 are respectively 8 µm, 20 µm and 30 µm. At a step illustrated in FIG. 5B, the n-type InGaAsP guide layer 302, the MQW tuning and active layer 307 and p-type InP first clad layer 305 are formed by way of MOVPE method. Since the width of the $SiO_2$ stripe 320 is differentiated at respective regions, the layer thickness of the MQW tuning and active layer 307 of the stripe region defined by the $SiO_2$ stripes 320, becomes thicker from the DBR region to the active region. Then, the wavelength composition is varied toward long wavelength from the DBR region to the active region in stepwise fashion. At a step illustrated in FIG. 5C, by performing etching of $SiO_2$ stripes 320 for both sides of the optical waveguide region for re-patterning into the stripe form. Then, by way of selective MOVPE method, p-type InP second clad layer 305' and p$^+$-type InGaAs cap layer 306 are selectively grown. Then, by forming the electrodes at the desired regions,the first embodiment of the wavelength tunable DBR laser can be completed.

Figure 6:
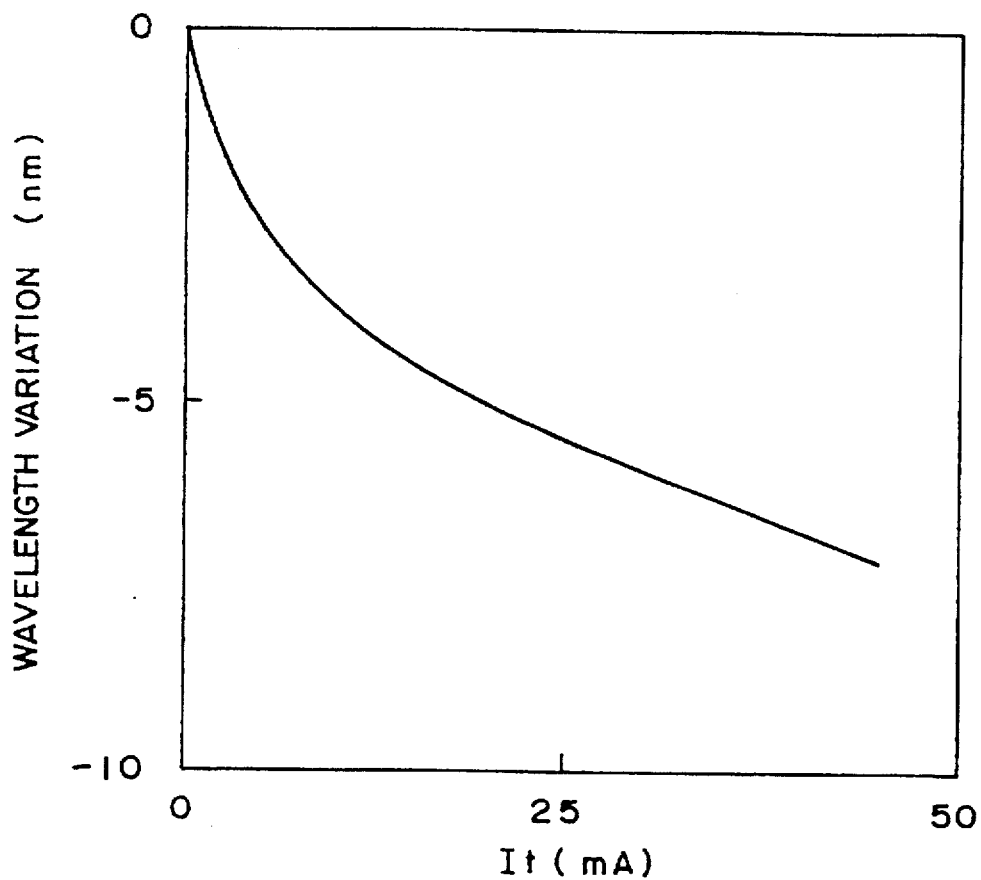
FIG. 6 is a characteristic chart showing a wavelength control characteristics of the first embodiment of the wavelength tunable semiconductor laser.

The threshold current of the shown embodiment of the wavelength tunable DBR laser is approximately 30 mA. FIG. 6 shows a characteristics of the wavelength upon injection of the tuning current to the electrode 315 is shown. In FIG. 6, the vertical axis represents a wavelength variation and the horizontal axis represents the tuning current It. Thus, approximately 7 nm of continuous wavelength control operation can be obtained without causing mode jump.

(Second Embodiment)

Figure 7:
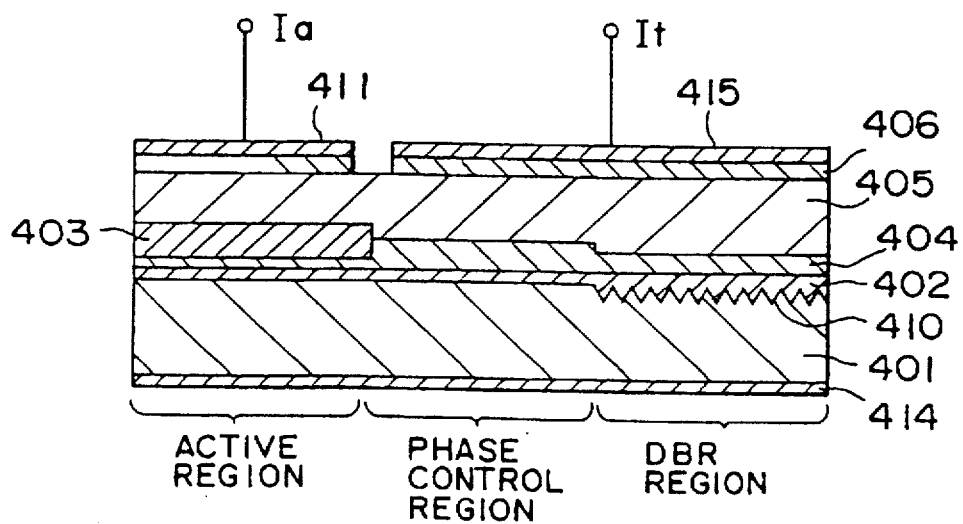
FIG. 7 is a section showing the construction of the second embodiment of the wavelength tunable semiconductor laser according to the invention.

FIG. 7 shows the structure of the second embodiment of the wavelength tunable DBR laser according to the invention. On the substrate partially formed with a diffraction grating 410, wavelength composition 1.3 µm of a n-type InGaAs guide layer 402 (having a thickness of 0.1 µm), and n$^-$-type InGaAs tuning layer 404 are formed. The layer thickness of the tuning layer 404 is 0.3 µm at the phase control region, 0.2 µm at the DBR region, and 0.1 µm at the active region. On the tuning layer 404 in the active region, InGaAs/InGaAsP MQW active layer 403 having ten wells is selectively formed. Then, on the overall surface, p-type InP cladding layer 405 (in the layer thickness of 2 µm) is formed. Also, in the active region, p$^+$-type InGaAs cap layer 406 and the electrode 411 are formed. Likewise, in the phase control region and the DBR region, the cap layer 406 and the electrode 415 are formed. On the other hand, beneath the substrate 401, a grounding electrode 414 is formed. The lengths of respective of the active region, the phase control region and the DBR region are $L_a$=300 µm, $L_{pc}$=300 µm and $L_{dbr}$=200 µm. $I_a$ is the laser current and $I_t$ is the tuning current.

Figure 8A:
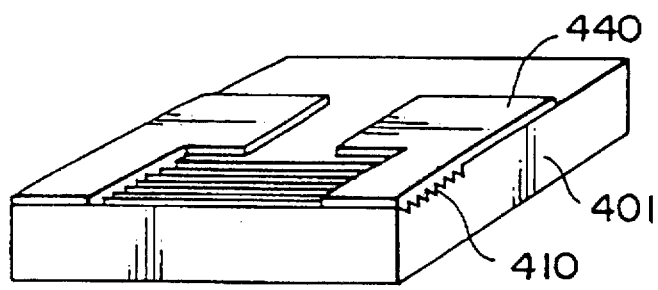
FIGS. 8A to 8D are perspective views showing a fabrication process of the second embodiment of the wavelength tunable semiconductor laser.
Figure 8B:
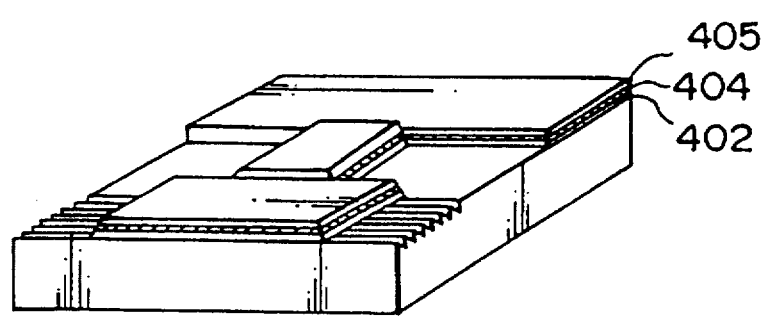
Figure 8C:
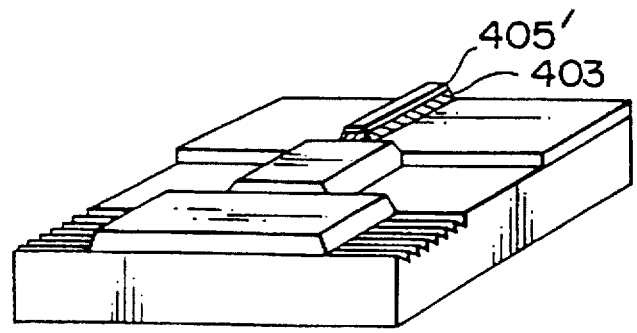
Figure 8D:
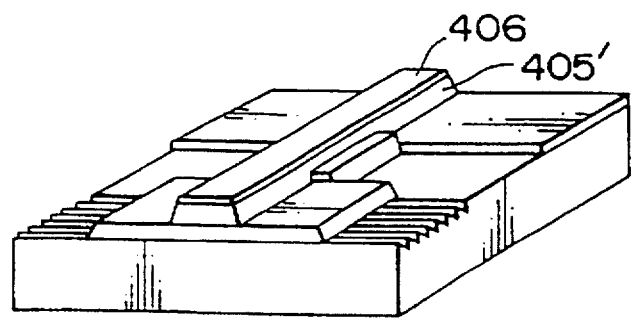

FIGS. 8A to 8C respective show process steps in fabrication of the second embodiment of the wavelength tunable DBR laser according to the invention. At a step illustrated in FIG. 8A, the diffraction grating 410 having period of 240 nm is partially formed on the n-type InP substrate 401. On the n-type InP substrate 401 with the diffraction grating 410, $SiO_2$ films 440 are patterned with defining window therebetween. The window width defined by the $SiO_2$ films 440 is the narrowest in the phase control region (approximately 10 µm) and wider (approximately 30 µm) in the DBR region. No $SiO_2$ film is formed in the active region. At a step illustrated in FIG. 8B, the n-type InGaAsP guide layer 402, the n$^-$-type InGaAsP tuning layer 404 and p-type InP first cladding layer 405 are selectively formed by way of MOVPE method. Subsequently, the $SiO_2$ film 440 is removed. At a step illustrated in FIG. 8C, the first cladding layer 405 in the active region is removed by etching. Thereafter, again by selective growth, a stripe form MQW active layer 403 of 1.5 µm width and thin p-type InP cladding layer 405' are formed. Then, at a step illustrated in FIG. 8D, a stripe form p-type InP second cladding layer 405' of 5.0 µm width and p$^+$-type InGaAs cap layer 406 are formed by selective growth through all of the regions. At this time, the second clad layer 405' covers the active layer 403 in the active region, and formed ridge waveguide in the phase control region and the DBR region. By subsequently forming the electrodes in the desired regions, the second embodiment of the wavelength tunable DBR laser is completed.

The second embodiment of the wavelength tunable DBR laser has the tuning layer which is thicker in the phase control region than that in the DBR region, and has longer wavelength composition than the latter. Therefore, the relationship of the foregoing equation (2) can be satisfied. Thus, similarly to the first embodiment, continuous wavelength control without causing mode jump can be realized.

It should be noted that while the foregoing first and second embodiment have been discussed in terms of the wavelength tunable semiconductor laser based on InGaAsP/InP compound semiconductor having lasing wavelength in 1.55 µm range, the present invention is effective for lasers formed with other compound semiconductor in other wavelength range. Also, while the foregoing discussion has been given for the buried-heterostructure laser utilizing the selective growth for the lateral mode control of the laser, the lateral mode control structure should not be specified to the shown structure but can be any other structures, such as the buried-heterostructure formed after mesa etching. Also, the active layer and the tuning layer may be either bulk semiconductor or MQW structure. Also, the positions of the active region and the phase control region may be reversed.

As set forth above, the first and second embodiments of the wavelength tunable DBR lasers according to the present invention may continuously control the wavelength by uniformly injecting tuning current to the phase control region and the DBR region. Also, the first and second embodiments of the wavelength tunable DBR lasers may overcome the problems of mode jump which is caused in wavelength control in the conventional DBR laser employing the resistance for dividing tuning current and of impedance missmatching which cause a problem in high speed wavelength switching. The continuously tunable range of the wavelength can be improved from conventional 3.8 nm to 7 nm.

Figure 9A:
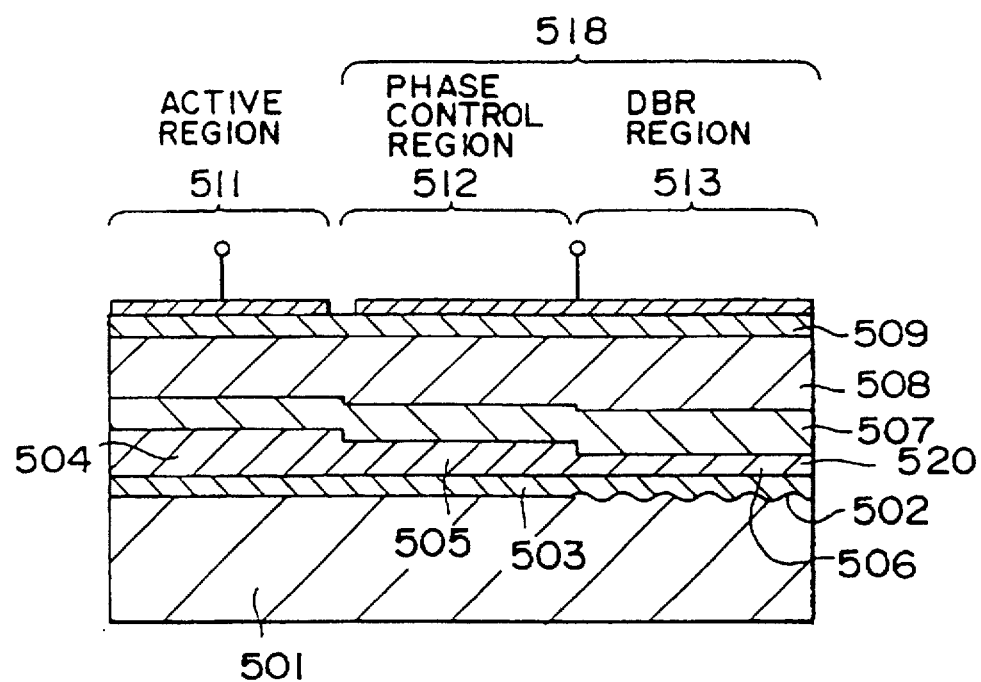
FIGS. 9A and 9B are respectively cross-section and a perspective view of the third embodiment of wavelength tunable semiconductor laser.
Figure 9B:
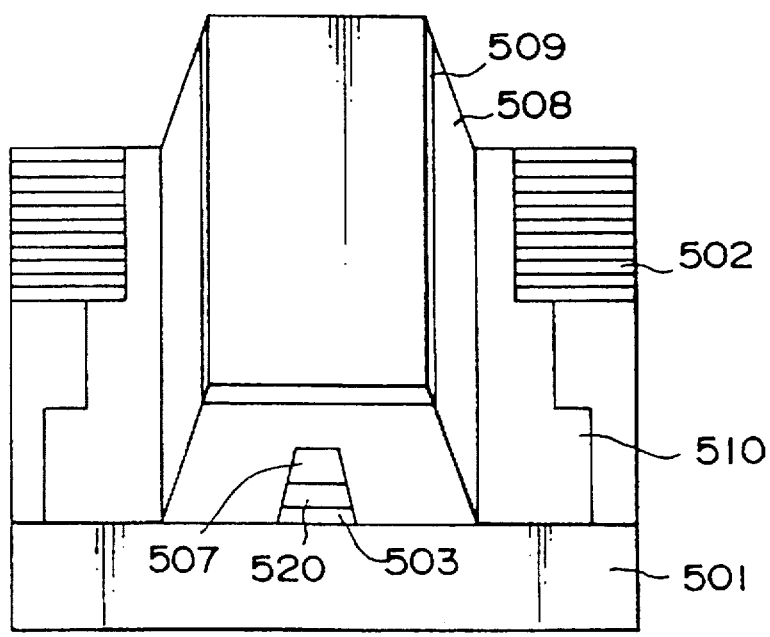

FIGS. 9A and 9B are respectively a lateral section and a perspective view as viewed from the light discharge direction, of the third embodiment of the wavelength tunable semiconductor laser according to the present invention. By mploying MOVPE method, a light emitting wavelength of the MQW layer can be controlled by varying the width of a mask 510 for selective growth at respective regions. The fabrication process of the element is as follows. At first, on a n-type InP substrate 501 having (100) surface orientation, on which a diffraction grating 502 having a period of 240 nm is partly formed, SiO$_2$ is grown over the entire surface. Then, two parallel stripes with an interval of 1.5 µm are patterned in the orientation of [011]. At this time, the widths of the mask 510 for selective growth are set respectively at 30 µm, 15 µm and 8 µm respectively for an active region 511 (200 µm length), a phase control region 512 (200 µm length) and a DBR region 513 (500 µm length). On these regions, an InGaAsP guide layer 503 having 1.2 µm wavelength composition, an MOW waveguide layer 520 forming an active layer 504, a phase control layer 505 and a DBR waveguide layer 506, and p-type InP clad layer 507 (0.6 µm thick) are grown.

Figure 10:
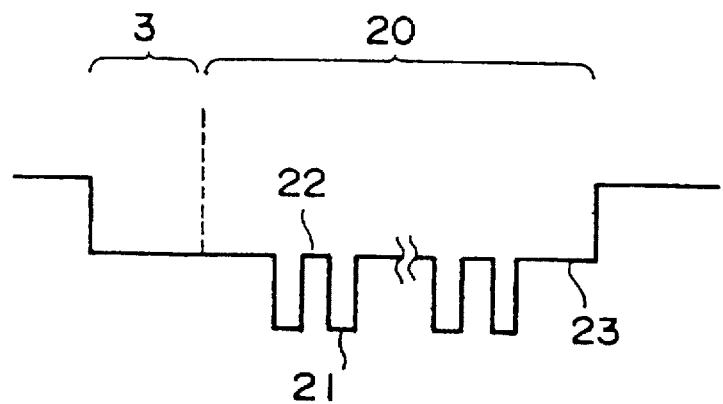
FIG. 10 is a chart illustrating energy band structure of a MQW waveguide layer of the third embodiment of the invention.

By employment of the selective MOVPE method, in the same growth process, the light emitting wavelength and thickness of the MQW waveguide layer 520 can be varied. The MQW waveguide layer 520 has a structure constituted of since levels of an InGaAs well region 521 (9 nm thick) having tensile strain of 0.6%, an InGaAsP barrier layer 522 (10 nm thick) having wavelength composition of 1.2 µm, and InGaAsP SCH layer (100 nm thick at one side) having the same composition to the barrier layer, as shown in FIG. 10. In the active region 511, the light emitting wavelength of the overall MQW layer is 1.55 µm. In respective of the phase control region 512 and the DBR region 513, the wavelength compositions are respectively 1.48 µm and 1.45 µm. At this time, owing to the characteristics of the selective growth, in the phase control region 512 and the DBR region 513 having narrower mask width, introduction ratio of In into the crystal layer becomes small to make tensile strain greater. In practice, the tensile strain of the InGaAs layer becomes −0.9% and −1.2% in the phase control region 512 and the DBR region 513.

Figure 11A:
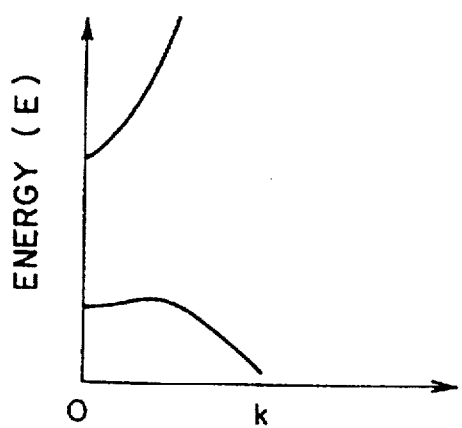
FIGS. 11A and 11B are illustration showing an energy band in the phase control layer and the DBR waveguide layer in the third embodiment of the wavelength tunable semiconductor laser.
Figure 11B:
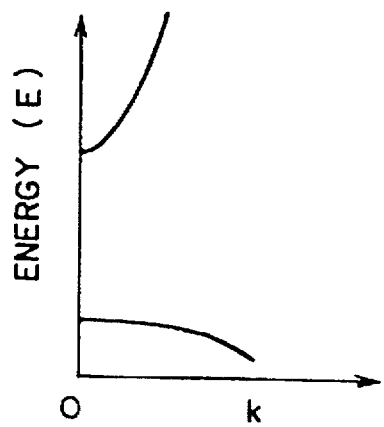

The energy band structure of the MQW structure in respective regions have been analyzed to be in the configurations as illustrated in FIGS. 11A and 11B. In particular, in the phase control region, it has been analyzed to have the configuration illustrated in FIG. 11A. In such case, as shown in the commonly owned Japanese Patent Application No. 5-153049, disclosure of which is herein incorporated by reference, it has been made clear through calculation that the energy distribution of the valence band is formed in the region other than the point Γ where k=0 to cause abrupt rising of the state density to cause significant variation of the refraction index by injection of current. Growth by the selective growth, the In composition of the well in the DBR region becomes smaller than that in the phase control region. In case of the shown embodiment, the tensile strain of 1.2% has been caused. While variation magnitude of the refraction index in response to injection of the current is relatively large, hen the current is applied with the same current density, the variation magnitude of the refraction index in the DBR region becomes smaller than the variation magnitude of the refraction index in the phase control region. Therefore, the foregoing equation (1) can be satisfied.

In the shown embodiment, after formation of mesa stripe including the MQW layer, the masks at both sides are removed in the extent of approximately 2 µm. Then, by similar selective growth method, a p-type InP buried layer 508, an InGaAsP contact layer 509 having wavelength composition of 1.3 µm are deposited in respective thicknesses of 1.5 µm and 0.4 µm. Over the phase control region 512 and the DBR region 513 a common electrode is formed to form a wavelength adjusting region. Thus, desired wavelength tunable DBR-LD is attained.

Figure 12:
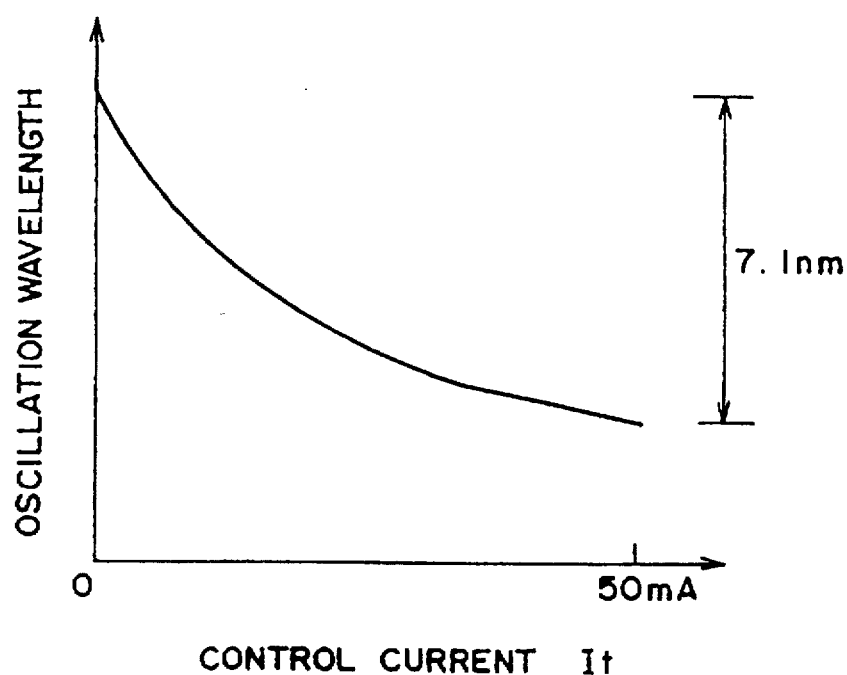
FIG. 12 is a chart showing the variable wavelength characteristics in the first embodiment of the wavelength tunable semiconductor laser.

In the shown embodiment of the wavelength tunable DBR-LD constructed as set forth above, when a control current is not supplied, 10 mA of the threshold value of the oscillation current, 0.2 W/A of slop efficiency and approximately 30 mW of maximum light output could be obtained. When the control current is supplied, as shown in FIG. 12, 7.1 nm of continuous wavelength tuning operation can be obtained by injecting approximately 50 mA of control current.

Figure 13:
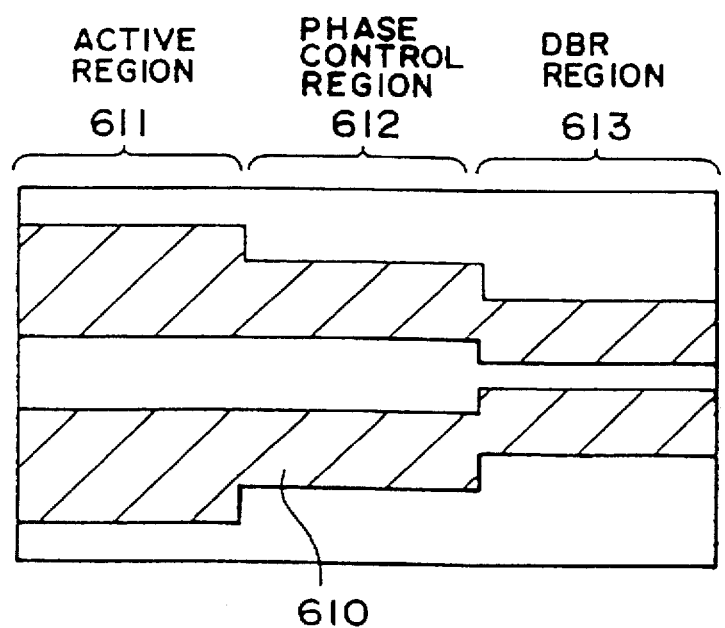
FIG. 13 is a plan view of the second embodiment of the wavelength tunable semiconductor laser according to be invention, in which the mask for selective growth is formed in advance of growth of the DBR wavelength tunable semiconductor laser diode, according to the fourth embodiment of the invention.
Figure 14:
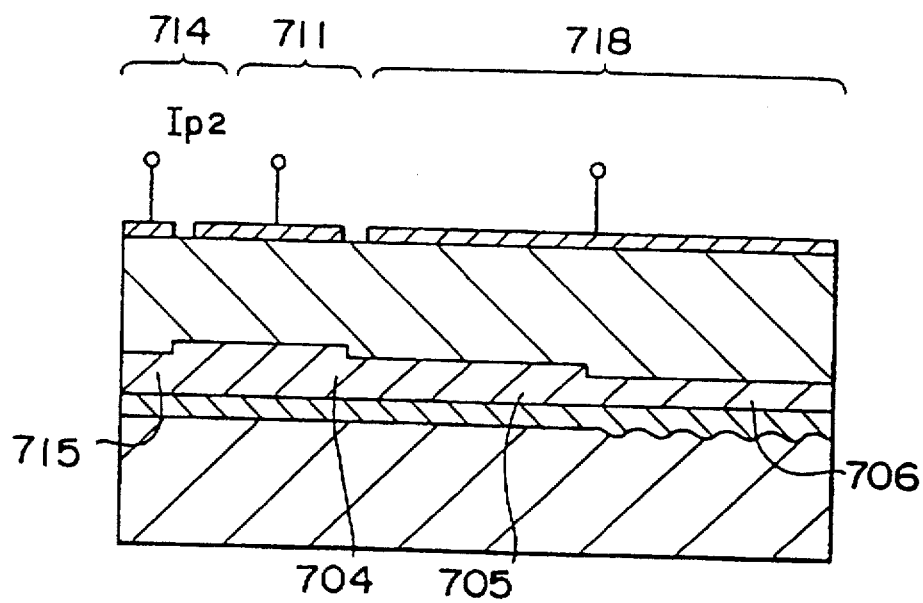
FIG. 14 is shows the construction in the lateral direction of Figure in the lateral direction of the fifth embodiment of the wavelength tunable semiconductor laser diode.

FIG. 13 is a plan view of a substrate where a mask 610 for selective growth is formed before growth of MQW layer, as employed the fourth embodiment of the wavelength tunable DBR-LD according to the present invention. Similarly to the foregoing third embodiment, the lengths of respective of an active region 611, a phase control region 612 and a DBR region 613 are 200 µm, 200 µm and 500 µm, respectively. In the shown embodiment, a region in the DBR region 613 defined by the mask 610 is set to be narrower than the width in other regions. In practice, the width in the DBR region 613 is set at 0.5 µm, while the widths in remaining regions are set at 1.8 µm. Above these, an InGaAsP guide layer 503, a MOW waveguide layer 520, a p-type InP cladding layer 507 are grown in the same process to the foregoing third embodiment(see FIG. 10A, 10B). Thereafter, by removing the masks at both sides of the mesa stripe in the extent of 3 µm in width, p-type InP buried layer 508, a p-type InGaAsP contact layer 509 are grown. Then, the electrodes are formed on the active region 611, the phase control region 612 and the DBR region 613. For the phase control region 612 and the DBR region 613, a common electrode is formed to establish the wavelength control region. In the shown embodiment, an InGaAs well layer substantially establishing lattice-matching is employed in the active region 611.

Evaluation of the characteristics was made by forming the laser-chip with these elements. Then, threshold value, the light output characteristics and approximately 6 nm of continuous wavelength tuning operation substantially comparable to the third embodiment could be attained.

Figure 15:
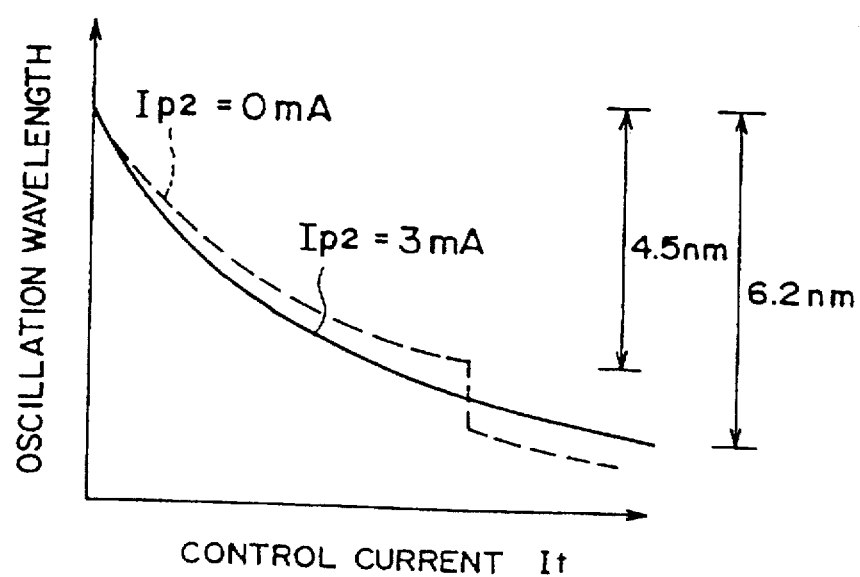
FIG. 15 is an illustration showing the operating condition for causing wave of the fifth embodiment of the DBR type wavelength tunable semiconductor laser.

FIG. 15 shows a section of the element in the lateral direction in the fifth embodiment of the wavelength tunable DBR-LD according to the present invention. The shown embodiment is characterized by a second phase control region 714 on the end face of an active region 711. The lengths of the active region 711 and the second phase control ration 714 are respectively 160 μm and 40 μm. The lengths of the phase control region and the DBR region are respectively 200μm and 500 μm. The fabrication process is the same as the third embodiment except for formation of the second phase control region. In this embodiment, in the active region 711, the MQW waveguide having the InGaAs well layer substantially establishing lattice-matching, is employed. The manner that after growth of the MQW waveguide and the cladding layer and so forth along resonance direction of the light having different wavelength composition by selective growth, a part of the mask is removed to grow the buried layer and the contact layer, is the similar to the fourth embodiment. In case of the shown embodiment, the electrodes are formed only on the active layer 711 and a wavelength control region, but also on the second phase control region 714. Therefore, three in total mutually independent electrodes are present.

Evaluation was made by forming the individual chip of the laser. It has been found that the threshold current, the slop efficiency and the maximum light output are respectively 15 mA, 0.18 W/A, and 25 mW. Such values have been attained with high reproductivity. The wavelength tuning characteristics of the element is as shown in FIG. 16. When the current is not supplied to the second phase control region, as shown by the curve of $I_{p2}=0$ in the drawing, the equation (1) may not be satisfied at certain control current value to cause mode jump. On the other hand, when setting is made for $I_{p2}=3$mA, the equation (1) can be satisfied in the wide range of the control current. Then, smooth wavelength tuning operation in the extent of 6.2 nm can be obtained.

In the foregoing embodiment, while discussion has been given for the case where the semiconductor material of a long wavelength band by forming the substrate with InP and the waveguide with the InGaAsP, the semiconductor material is not specified to the shown materials, but can employ any other semiconductor material, such as GaAs type, InAlAs type and so forth. As the structure of the waveguide, buried-heterostructure has been disclosed in all of the embodiments, it is possible to form the DBR region in the ridge structure to improve wavelength setting. Such element can be easily fabricated by the selective MOVPE method. Also, the construction may be used with arbitrary combination As set forth above, in the foregoing third to fifth embodiments, (a) a semiconductor layer having an energy band structure which becomes negative effective mass at the valence band, (b) the width of the phase control layer is set to be greater than the width of the DBR layer, and (c) the second phase control region is formed. By these, the continuous wavelength tuning operation in the wide wavelength range which could not be achieved by the prior art. Such semiconductor laser should be a key device in application of the wavelength divided multiplying communication system.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A fabrication process of a wavelength tunable semiconductor laser comprising steps of:

forming a stripe-form tuning layer at a portion of a semiconductor substrate corresponding to a phase control region and a distributed Bragg reflector region, and forming a stripe-form active layer at a portion of said semiconductor substrate corresponding to an active region;

forming a refraction grating adjacent said tuning layer of said distributed Bragg reflector region;

forming a cladding layer for burying a stripe for said stripe-form tuning layer and said active layer; and forming electrodes on an upper portion of said active region, said phase control region and said distributed Bragg reflector region and a lower portion of said substrate, said tuning layer and said active layer being formed simultaneously by a selective metallic-organo vapor phase epitaxy (MOVPE) method so as to satisfy one of a condition that a layer thickness of said tuning layer of said phase control region is thicker than a layer thickness of said tuning layer of said distributed Bragg reflector region, and that a length of a wavelength composition of said phase control region is longer than that of said distributed Bragg reflector region and is shorten than that of a wavelength composition of said active layer of said active region.

* * * * *